United States Patent
Yang et al.

(10) Patent No.: US 9,153,336 B1
(45) Date of Patent: *Oct. 6, 2015

(54) DECODER PARAMETER ESTIMATION USING MULTIPLE MEMORY READS

(71) Applicant: Marvell International Ltd., Hamilton (BM)

(72) Inventors: Xueshi Yang, Cupertino, CA (US); Shashi Kiran Chilappagari, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 82 days.

This patent is subject to a terminal disclaimer.

(21) Appl. No.: 14/070,089

(22) Filed: Nov. 1, 2013

Related U.S. Application Data

(63) Continuation of application No. 13/089,135, filed on Apr. 18, 2011, now Pat. No. 8,576,625.

(60) Provisional application No. 61/333,529, filed on May 11, 2010, provisional application No. 61/326,130, filed on Apr. 20, 2010.

(51) Int. Cl.
  *G11C 16/34* (2006.01)
  *G06F 11/10* (2006.01)
  *G11C 16/26* (2006.01)

(52) U.S. Cl.
  CPC ........ *G11C 16/3422* (2013.01); *G06F 11/1068* (2013.01); *G11C 16/26* (2013.01)

(58) Field of Classification Search
  CPC ........................... G11C 16/06; G11C 16/3422
  See application file for complete search history.

(56) References Cited

U.S. PATENT DOCUMENTS

| | | | |
|---|---|---|---|
| 7,551,478 B2 | 6/2009 | Kanno | |
| 7,688,634 B2 | 3/2010 | Richter et al. | |
| 7,903,468 B2 * | 3/2011 | Litsyn et al. | 365/185.24 |
| 8,072,805 B2 | 12/2011 | Chou et al. | |
| 8,156,403 B2 * | 4/2012 | Shalvi et al. | 714/764 |
| 8,259,497 B2 | 9/2012 | Shalvi et al. | |
| 8,665,650 B2 | 3/2014 | Yang | |
| 2007/0174740 A1 | 7/2007 | Kanno | |
| 2009/0003058 A1 | 1/2009 | Kang | |
| 2009/0199074 A1 | 8/2009 | Sommer | |
| 2009/0292972 A1 | 11/2009 | Seol et al. | |
| 2011/0038205 A1 | 2/2011 | Chou et al. | |
| 2012/0213001 A1 | 8/2012 | Yang | |
| 2014/0185386 A1 | 7/2014 | Yang | |

FOREIGN PATENT DOCUMENTS

| | | |
|---|---|---|
| WO | WO2007049272 A2 | 5/2007 |
| WO | WO2008053472 A2 | 5/2008 |

OTHER PUBLICATIONS

The PCT Search Report and Written Opinion mailed May 4, 2012, for PCT Application No. PCT/US12/25482, 10 pages.

* cited by examiner

*Primary Examiner* — Vanthu Nguyen

(57) ABSTRACT

An apparatus including a memory array and control circuitry. The control circuitry is configured to, based at least on a plurality of read comparison results, determine a number of memory cells of the memory array that have threshold voltages that fall into each of a plurality of voltage ranges. The control circuitry is further configured to, based at least on the number of memory cells that have threshold voltages in each of the plurality of voltage ranges, estimate an offset amount that a center voltage between two threshold voltage distributions differs from a center reference voltage. The control circuitry is further configured to read one or more of the plurality of memory cells based at least in part on the estimated offset amount.

24 Claims, 5 Drawing Sheets

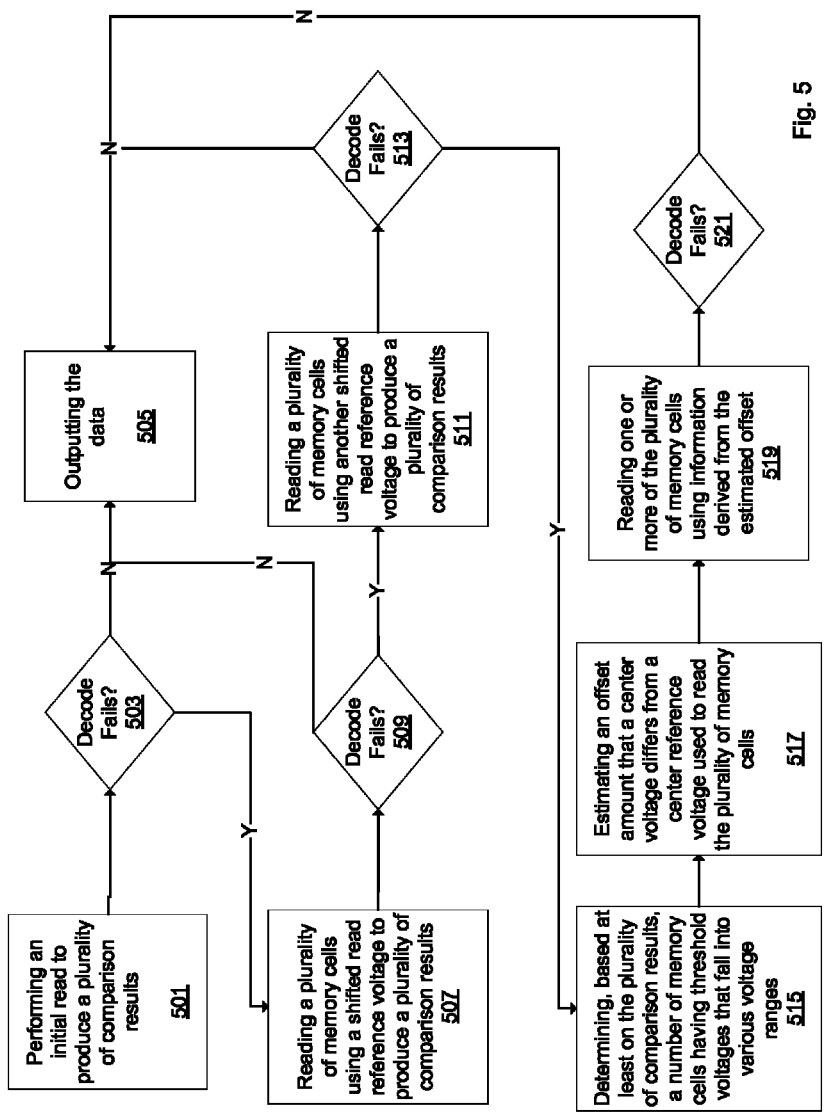

DECODER PARAMETER ESTIMATION USING MULTIPLE MEMORY READS

CROSS REFERENCE TO RELATED APPLICATIONS

The present disclosure is a continuation of and claims priority to U.S. patent application Ser. No. 13/089,135, filed Apr. 18, 2011, now U.S. Pat. No. 8,576,625, issued Nov. 5, 2013, which claims priority to U.S. Provisional Patent Application No. 61/333,529, filed May 11, 2010, and U.S. Provisional Patent Application No. 61/326,130, filed Apr. 20, 2010, which are incorporated herein by reference.

TECHNICAL FIELD

The present disclosure relates to the field of digital memories, and more particularly to methods, apparatuses, and systems for estimating decoder parameters by performing multiple reads on memory cells using several read reference voltages.

BACKGROUND

The background description provided herein is for the purpose of generally presenting the context of the disclosure. Work of the presently named inventors, to the extent it is described in this background section, as well as aspects of the description that do not otherwise qualify as prior art at the time of filing, are neither expressly nor impliedly admitted as prior art against the present disclosure.

In flash memory devices, data is stored by programming the cells to different voltage levels. A k-bits-per-cell flash device stores k bits in a single cell and has $2^k$ voltage regions with each region corresponding to one of the possible $2^k$ k-bit patterns. A k-bit pattern is stored by programming the cell to a nominal voltage value in the corresponding voltage region. The actual stored voltage within a particular memory cell is subject to noise and hence can differ from the nominal value. The exact value of the stored voltage cannot be read out directly, but can only be compared to a read reference voltage for most practical devices. Also, the primary goal is to find the k-bit pattern corresponding to the stored voltage rather than the voltage itself. Therefore, the cells are read by comparing the stored values in the cell to one or more read reference voltages.

A floating-gate transistor of a flash memory cell is capable of storing a voltage on its floating gate for a period, typically many years. The threshold voltages that correspond to the stored charge on the floating gate of the floating-gate transistor will change over time due to, for example, physical changes in the device. Such physical changes may result from device aging, repeated erase and program cycles, and so forth. A group of flash memory cells will therefore exhibit a change in their overall threshold voltage distributions over time. Such changes will result in greater error rates, which will worsen as the device ages.

SUMMARY

Some of the embodiments of the present disclosure provide an apparatus comprising a memory array; and a control circuitry coupled to the memory array, wherein the control circuitry is configured to (i) based at least on a plurality of read comparison results, determine a number of memory cells of the memory array that have threshold voltages that fall into each of a plurality of voltage ranges; (ii) based at least on the number of memory cells that have threshold voltages in each of the plurality of voltage ranges, estimate an offset amount that a center voltage between two threshold voltage distributions differs from a center reference voltage; and (iii) read one or more of the plurality of memory cells based at least in part on the estimated offset amount. In an embodiment, the center reference voltage is an original center reference voltage, and the control circuitry is further configured to determine a modified center reference voltage based at least in part on the original center reference voltage and the offset amount, and the control circuitry is further configured to read one or more of the plurality of memory cells based at least in part on the modified center reference voltage. In an embodiment, the control circuitry is further configured to perform an initial read based on the center reference voltage, and the control circuitry is further configured to perform, upon a determination of a decode failure associated with the initial read, the reads of one or more of the plurality of memory cells of the memory array using a plurality of read reference voltages. In an embodiment, each of the plurality of ranges has at least one end-point between a mean of the two threshold voltages distributions. Each of the plurality of read reference voltages are between two threshold voltage distributions. The control circuitry is further configured to read one or more of the plurality of memory cells based at least in part on information derived from the estimated offset amount, where said information includes updated log likelihood ratios for each of the plurality of voltage ranges. The control circuitry is further configured to read one or more of the plurality of memory cells based at least in part on information derived from the estimated offset amount, where said information includes a new read reference voltage determined using the estimated offset amount. The control circuitry is further configured to estimate the offset amount in part by iterative calculation of sets of bin data to determine a threshold voltage distribution parameter set that approximates the determined numbers of memory cells that have threshold voltages in each of the plurality of voltage ranges, and the parameter set includes estimated offset amounts of the two threshold voltage distributions and variance estimates of the two threshold voltage distributions.

There is also provided a method, comprising based at least on a plurality of read comparison results, determining a number of memory cells that have threshold voltages that fall into various voltage ranges; based at least on the numbers of memory cells that have threshold voltages in the various voltage ranges, estimating an offset amount that a center voltage between two threshold voltage distributions differs from a center reference voltage used to read the plurality of memory cells; deriving information from the estimated offset amount; and reading one or more of the plurality of memory cells using the information derived from the estimated offset amount. In an embodiment, the method further comprises performing an initial read based on the center reference voltage, wherein said determining the number of memory cells and said estimating the offset amount occur upon a determination of a decode failure associated with the initial read. The information derived from the estimated offset amount includes updated log likelihood ratios for one or more of the plurality of voltage ranges. The information derived from the estimated offset amount includes a new read reference voltage determined using the offset amount. In an embodiment, the estimating the offset amount includes iterative calculation of sets of bin data to determine a distribution parameter set that approximates the determined numbers of memory cells that have threshold voltages in each of the plurality of voltage ranges, and the distribution parameter set includes the offset estimates of the two threshold voltage distributions and variance estimates of the two threshold voltage distributions.

There is also provided a system comprising a memory device including a memory array; a memory controller coupled to the memory device and configured to receive from the memory device a plurality of comparison results resulting from a plurality of reads on a plurality of memory cells of the memory array using a plurality of read reference voltages, including a center reference voltage; based at least on the plurality of comparison results, determine a number of memory cells of the memory array that have threshold voltages that fall into each of a plurality of voltage ranges; based at least on the numbers of memory cells that have threshold voltages in each of the plurality of voltage ranges, estimate an offset amount that a center voltage between two distributions of the threshold voltages differs from the center reference voltage; derive information from the estimated offset amount; and cause the memory device to read one or more of the plurality of memory cells using information derived from the estimated offset amount.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is noted that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

FIG. 5 illustrates a flow chart of a decode with retry in accordance with various embodiments.

DETAILED DESCRIPTION

Embodiments of the present disclosure include memory devices and memory controllers configured to improve decoding of memory cell reads, and in particular flash memory cell reads. In embodiments, multiple reads of a group of memory cells are performed using various read reference voltages. The results of those multiple reads are used to group the memory cells according to whether those memory cells that have threshold voltages that fall into certain voltage ranges. Several techniques described herein can be used to estimate, calculate, or determine an offset amount that a center voltage between two threshold voltage distributions differs from a center reference voltage. The offset, and in some embodiments a variance, of the threshold voltage distributions are used to estimate one or more decoder parameters. In some embodiments, the estimated decoder parameter is a new read reference voltage for "hard decoding" of the memory cells. In other embodiments, the estimated decoder parameters include soft information, such as log-likelihood-ratios (LLR) for the threshold voltage ranges.

Figure 1:
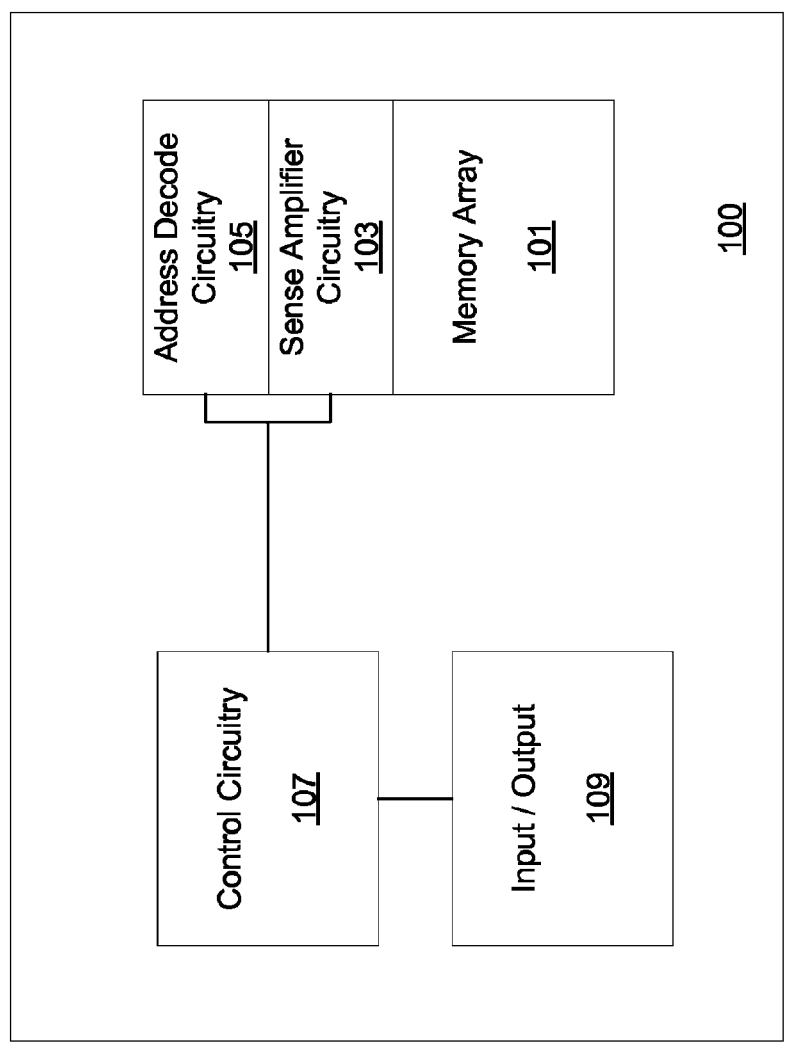
FIG. 1 schematically illustrates a memory device configured to perform decode parameter estimation according to various embodiments.

FIG. 1 schematically illustrates a memory device configured to perform decoder parameter estimation according to various embodiments. Memory device 100 includes memory array 101 coupled to sense amplifier circuitry 103 and address decode circuitry 105. Control circuitry 107 is coupled to the memory array 101 and to input/output (I/O) 109, which is coupled to one or more I/O pins (not shown). Control circuitry 107 is configured to perform reads, or cause reads to be performed, on a plurality of memory cells of memory array 101 using a plurality of read reference voltages, including a center reference voltage. The plurality of reads produces a plurality of comparison results. Control circuitry is also configured to determine, based at least on the plurality of comparison results, a number of memory cells of memory array 101 having threshold voltages that fall into each of a plurality of voltage ranges or bins. Control circuitry 107 is configured to estimate, based at least on the numbers of memory cells having threshold voltages in each of the plurality of voltage ranges, an offset amount that a center voltage between two discrete distributions of the threshold voltages differs from the center reference voltage. As will be discussed in more detail herein later, in an example, the center reference voltage refers to a center voltage between two distributions of the threshold voltages while, for example, the memory device 100 was manufactured. In another example, the center reference voltage refers to a center voltage between two nearly optimal distributions of the threshold voltages (i.e., the center reference voltage is substantially an optimal or original center reference voltage). The offset amount is a shift in the center voltage due to, for example, aging of the memory device 100, repeated read and write cycles performed on the memory device 100, noise, and/or the like. In an example, the center reference voltage is shifted over time, by the offset amount, to create a modified center reference voltage.

As described in more detail below, the estimated offset is used to estimate various decoder parameters using various techniques. Control circuitry 107 is configured to read, or cause to be read, one or more threshold voltages of one or more of the memory cells of memory array 101 using information, such as an estimated decoder parameter, derived from the estimated offset.

Control circuitry 107 is configured to perform, or cause to be performed, an initial read on one or more of the memory cells of memory array 101 and then to perform the reads on a plurality of memory cells of the memory array using a plurality of read reference voltages upon a determination of a decoding failure associated with the initial read. In other words, if the initial read results in an error, control circuitry 107 is configured to implement the decoder parameter estimation procedure and to use the estimated decoder parameter (such as a new read reference voltage, improved LLR(s), or other parameter or parameters) to perform one or more additional reads of the memory cells. In alternative embodiments, control circuitry 107 will use the estimated decoder parameter, such as improved LLR information, to perform a decoding using the data that is read from the memory cells during the initial read.

As noted above, control circuitry 107 is configured to estimate, based at least on the numbers of memory cells having threshold voltages in each of the plurality of voltage ranges, an offset amount that a center voltage between threshold voltage distributions differs from the center reference voltage. In embodiments, each of the plurality of ranges has at least one end-point between two nominal storage voltages of the distribution. Further, in embodiments each of the plurality of read reference voltages are between two nominal storage voltages of the two distributions. For example, the memory cells in memory array 101 may have a threshold voltage distribution centered near −1V when storing a binary "1" and a threshold voltage distribution centered near +1V when storing a binary "0" (other storage voltages could be used without departing from the scope of embodiments). In this case, −1V and +1V can be thought of as nominal storage voltages of the memory cell and the center reference voltage is about 0V. But due to noise and other factors, the actual threshold voltages of the memory cell may differ to some extent from these nominal voltages.

As noted above, the information derived from the estimated offset (i.e., the estimated decoder parameters) includes in embodiments updated LLR information. Such LLR information may be for each of the plurality of voltage ranges. See below for further discussion of LLR and its use in soft decoder and/or soft decoding.

In other embodiments, the information derived from the estimated offset includes a new read reference voltage determined using the offset amount. In particular, the new read reference voltage may be determined by adding the offset voltage to the center reference voltage to arrive at the new read reference voltage (also referred to herein as a modified center reference voltage). The new read reference voltage is equal to the center voltage of the two threshold voltage distributions.

Control circuitry 107 is configured in various embodiments to perform a maximum-likelihood method, a bisection method, and/or a predict-and-correct approach to estimate the offset and variance. Other methods can be employed without departing from the scope of embodiments. These various techniques to estimate the offset are described elsewhere within this Detailed Description.

Figure 2:
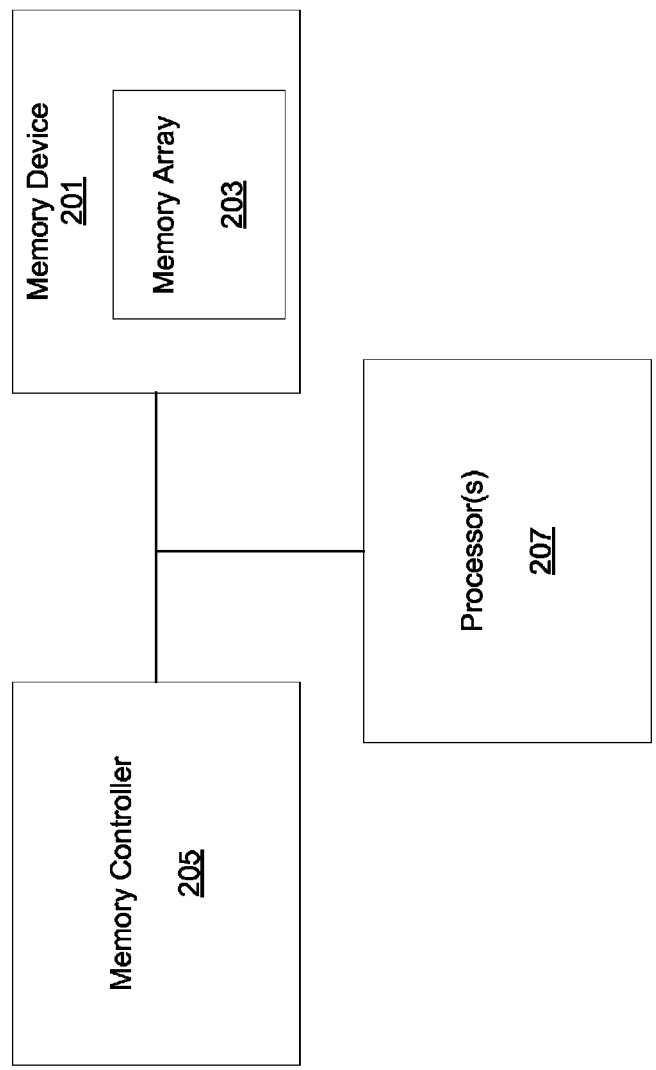
FIG. 2 schematically illustrates a computing system having a memory device and a memory controller in accordance with various embodiments.

FIG. 2 schematically illustrates a computing system having a memory device and a memory controller in accordance with various embodiments. Memory device 201 includes one or more memory arrays, such as memory array 203. Memory device 201 is coupled to memory controller 205 which coordinates memory access to one or more processors 207. Embodiments of the system shown in FIG. 2 include various other devices not shown, such as for example additional memory devices, one or more busses, input/output devices, and so forth Memory controller 205 is configured to receive from memory device 201 a plurality of comparison results resulting from a plurality of reads on a plurality of memory cells of memory array 203. The plurality of reads is performed using a plurality of read reference voltages, including the center reference voltage. Memory controller 205 is configured to determine, based at least on the plurality of comparison results, a number of memory cells of memory array 203 having threshold voltages that fall into each of a plurality of voltage ranges. Memory controller 205 is configured to estimate, based at least on the numbers of memory cells having threshold voltages in each of the plurality of voltage ranges, an offset amount that a center voltage between two threshold voltage distributions differs from the center reference voltage. Memory controller 205 is configured to cause the memory device to read one or more of the plurality of memory cells using information derived from the estimated offset.

As noted above, the information derived from the estimated offset (i.e., the estimated decode parameters) includes in embodiments updated LLR information. Such LLR information may be for each of the plurality of voltage ranges. See below for further discussion of LLR and its use in soft decoder and/or soft decoding.

In other embodiments, the information derived from the estimated offset includes a new read reference voltage determined using the offset. In particular, the new read reference voltage may be calculated by adding the offset voltage to the center reference voltage to arrive at the new read reference voltage.

Memory controller 205 is configured in various embodiments to perform a maximum-likelihood method, a bisection method, and/or a predict-and-correct approach to estimate the offset and variance of the threshold voltage distributions. Other methods can be employed without departing from the scope of embodiments. These various techniques to estimate the offset are described elsewhere within this Detailed Description.

Figure 3:
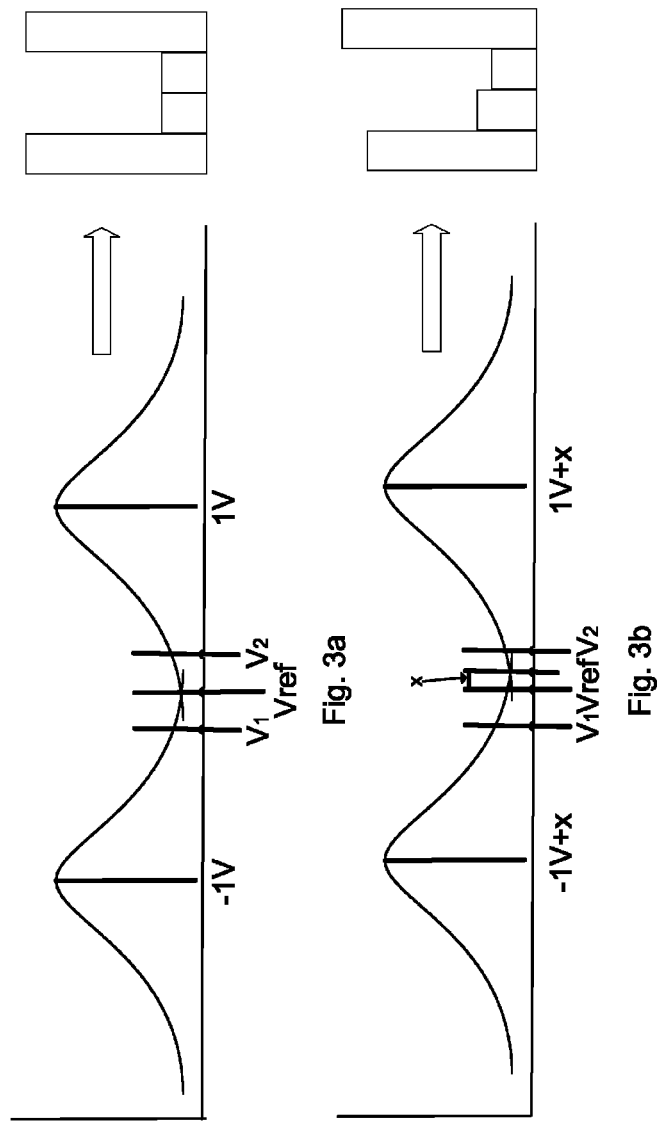
FIGS. 3a-b illustrate a threshold voltage distribution shift in accordance with various embodiments.

FIGS. 3a-b illustrate a threshold voltage distribution shift in accordance with various embodiments. FIG. 3a illustrates a non-shifted threshold voltage distribution for a plurality of memory cells. The threshold voltage distribution includes two discrete distributions which can, for purposes of the present disclosure, be assumed to be Gaussian. The two discrete distributions are centered at −1V and +1V, respectively; other nominal storage voltages can be used without departing from embodiments. A center reference voltage $V_{ref}$ denotes a voltage used to perform hard decoding. Because the distributions shown in FIG. 3a are non-shifted, $V_{ref}$ corresponds closely with a center voltage of the two distributions.

The voltage distributions shown in FIG. 3a are for a group of one-bit memory cells. But embodiments of the present disclosure can be generalized to k-bit memory cells, where k is greater than or equal to 1.

In various embodiments, multiple fractional reads are employed to determine soft decode information. Such multiple fractional reads use additional read reference voltages that differ from $V_{ref}$. For example, as shown in FIG. 3a, read reference voltages $V_1$ and $V_2$ may be used to perform additional reads. In a read of a memory cell employing partial fractional reads, the threshold voltage of a memory cell is compared to $V_{ref}$, $V_1$, and $V_2$ to determine whether the memory cell's threshold voltage falls into one of four voltage ranges, or bins. The four voltage ranges are defined as less than $V_1$, between $V_1$ and $V_{ref}$, between $V_{ref}$ and $V_2$, and greater than $V_2$. Knowing which range a cell's threshold voltage falls into allows a soft decoder to use additional "soft" information to decode the bit value stored in the memory cell; such soft information includes LLR information. For example, a threshold voltage falling into the bin that is less than $V_1$ and a threshold voltage falling into the bin that is between $V_1$ and $V_{ref}$ both correspond to the same binary value (for example a "1"). But the threshold voltage falling into the bin that is less than $V_1$ is more likely to be a binary "1" than is the threshold voltage that falls into the bin that is between $V_1$ and $V_{ref}$. LLR will next be briefly described.

For every cell threshold voltage V, we can assign a probability $P_1(V_s)$ that the voltage $V_s$ corresponds to a binary 1, and we can assign a probability $P_0(V_s)=1-P_1(V_s)$ that the voltage $V_s$ corresponds to a binary 0. (For example, in FIG. 3a, the left-hand distribution may correspond to a binary "1" and the right-hand distribution may correspond to a binary "0", and vice versa.) The ratio $P_0(V_s)/P_1(V_s)$ is known as the likelihood ratio and the quantity $\log(P_0(V_s)/P_1(V_s))$ is known as the log-likelihood ratio (LLR). If the LLR corresponding to a voltage or voltage range is greater than zero, it implies that the bit stored is more likely to be a binary 0 than a binary 1. If the LLR corresponding to a voltage is less than zero, it implies that the bit stored is more likely to be a 1 than a 0. And if the LLR corresponding to a voltage is equal to zero, it implies that the bit stored is equally likely to be a 0 or a 1. If the exact value of the stored voltage $V_s$ is known and if the probability density function (PDF) of the noise is known, then the value of $P_1(V_s)$ and consequently the LLR can be computed. Knowing the threshold voltage of a particular memory cell with great precision would be difficult. For example, the threshold voltage of a particular memory cell could be determined by performing a very large number of reads using a large number of read reference voltages. Performing such a large number of reads would be time-consuming and potentially cause read disturbances.

Because it would be difficult to know with great precision the actual value of a cell's threshold voltage, embodiments determine a range of voltages that the threshold voltage falls into. And instead of computing the LLR for a specific value of a threshold voltage (which would require knowing the exact threshold voltage), embodiments compute the LLR for a range of voltages, if the noise PDF is known. An initial set of LLRs for a memory device could be assumed to be for a non-shifted distribution as is shown in FIG. 3a. As shown in the histogram shown in FIG. 3a, the bin counts of the threshold voltages of the distributions are symmetrical.

FIG. 3b illustrates a shifted threshold voltage distribution. The center voltage and the mean voltages of the distributions are all offset from the voltages shown in FIG. 3a by x. And, as shown in the histogram in FIG. 3b, the bin counts for the various voltage ranges are not equal. In this case, assuming LLRs for soft decoding based on a non-shifted distribution results in more errors. Thus, embodiments of the present disclosure utilize various methods (described elsewhere within this Detailed Description) to utilize the bin counts to determine the offset x and a variance of the distributions in order to determine improved decoder parameters, such as improved LLRs for the various regions. Such improved LLRs account for both the shift as well as the noise variance.

In other embodiments, the improved decoder parameter derived from the bin counts is an improved read reference voltage (i.e. an improved $V_{ref}$) for performing reads on the plurality of memory cells. An improved read reference voltage is, in embodiments, equal to $V_{ref}$ adjusted by the offset x. The improved read reference voltage is also referred to herein as a modified center reference voltage, as the improved read reference voltage is the center voltage of the two modified threshold voltage distributions (as illustrated in FIG. 3b).

Several flow charts illustrating various embodiments will next be described. Following that, various numerical techniques to estimate the offset and variance of the shifted distributions will be described. Finally, a technique to estimate improved LLRs from the determined offset and variances will be described.

Figure 4:
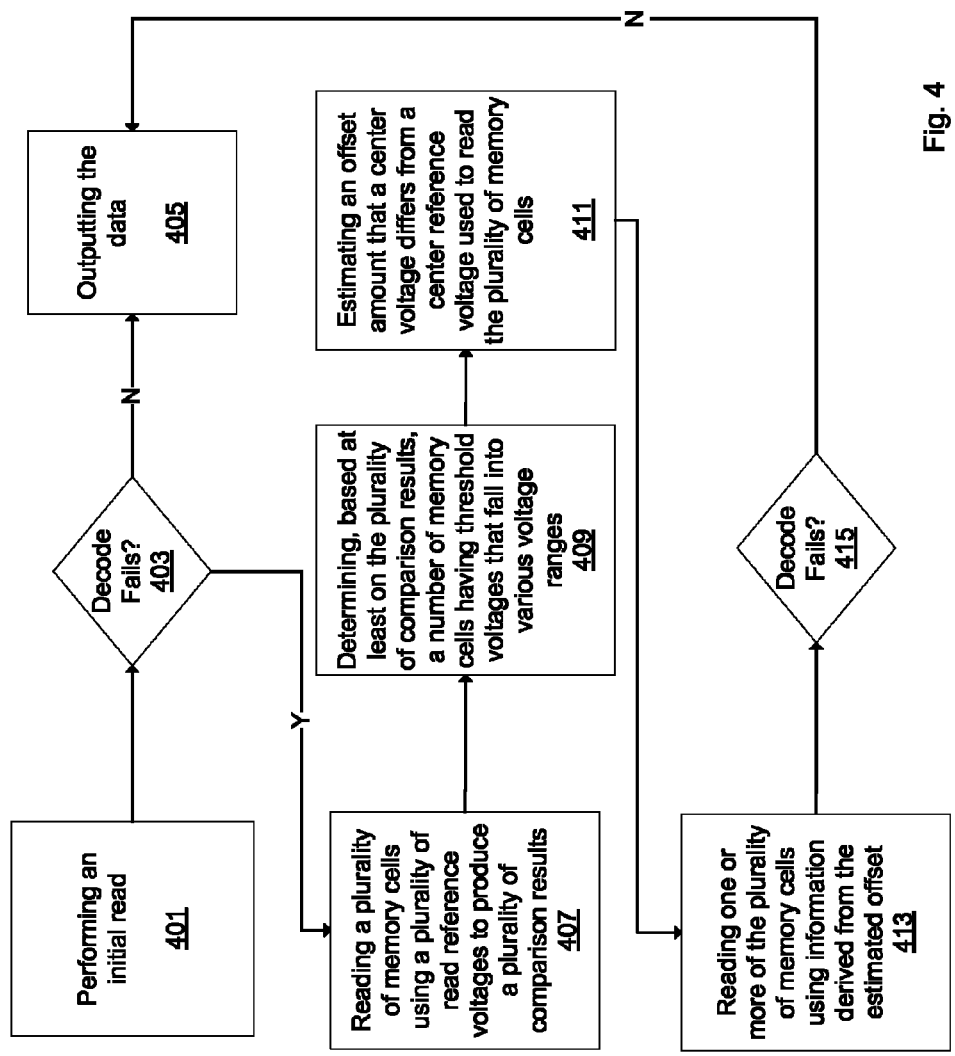
FIG. 4 illustrates a flow chart of a decode in accordance with various embodiments.

FIG. 4 illustrates a flow chart of a decode in accordance with various embodiments. Embodiments include performing, at 401, an initial read. This initial read may be of a plurality of memory cells, such as a page. Next, at 403, a determination of a decoding failure associated with the initial read takes place. If no decoding failure has occurred, embodiments include, at 405, outputting the data. If a decoding failure occurs, embodiments include, at 407, reading a plurality of memory cells using a plurality of read reference voltages to produce a plurality of comparison results. Next, techniques include determining, at 409, based at least on the plurality of comparison results, a number of memory cells having threshold voltages that fall into various voltage ranges. Next, embodiments include, at 411, estimating, based at least on the numbers of memory cells having threshold voltages in the various voltage ranges, an offset amount that a center voltage between two threshold voltage distributions differs from a center reference voltage used to read the plurality of memory cells. Various methods for estimating the offset are described elsewhere within this Detailed Description. Embodiments include, at 413, reading one or more of the plurality of memory cells using information derived from the estimated offset. For example, a new read reference voltage is derived from the estimated offset (e.g., the new read reference voltage is the center reference voltage that is shifted by the estimated offset), and the new read reference voltage is used to read the one or more of the plurality of memory cells at 413. The information derived from the estimated offset includes, in various embodiments, hard or soft decode information. Soft decode information includes improved LLR information. Hard decode information includes the new read reference voltage. In embodiments, at 415, a second decode check is performed. If there is no failure, the data is output. If there is a decoder and/or decoding failure, the process may end or there may be one or more decoding retries.

FIG. 5 illustrates a flow chart of a decoder with retry, in accordance with various embodiments. Embodiments include performing, at 501, an initial read; thus the initial read may provide a plurality of comparison results. This initial read may be of a plurality of memory cells, such as a page. Next, at 503, a determination of a decode failure associated with the initial read takes place. If no decoding failure has occurred, embodiments include outputting the data at 505. If a decoding failure occurs, embodiments include reading, at 507, a plurality of memory cells using a shifted read reference voltage to produce a second plurality of comparison results. In an embodiment, the shifted read reference voltage is determined by shifting an initial read reference voltage (e.g., the central reference voltage) by an appropriate amount.

Another decode failure check is performed, at 509, on the data that is read using the shifted read reference voltage. If the new read is successfully decoded, the data is output. If the second read decode fails, then embodiments perform at 511 another read of the memory cells occurs using a second shifted read reference voltage, where the second shifted read reference voltage is determined by shifting the shifted read reference voltage by an appropriate amount. This second shifted read reference voltage is, in embodiments, shifted by an amount that is the same as the first shifted read reference voltage, but in the opposite direction. For example, if the first shifted read reference voltage is equal to the initial read reference voltage plus 0.05V, then the second shifted read reference voltage is equal to the initial read voltage minus 0.05V. The read performed using the second shifted read reference voltage produces a third plurality of comparison results.

Once again, another decode failure check is performed at 513 on the data that is read using the second shifted read reference voltage. If the data read using the second shifted read reference voltage is successfully decoded, then the data is output. But if this third decode check is also unsuccessful, then techniques include, at 515, determining, based at least on the plurality of comparison results from the various reads of the plurality of memory cells, a number of memory cells having threshold voltages that fall into various voltage ranges. Next, embodiments include, at 517, estimating, based at least on the numbers of memory cells having threshold voltages in the various voltage ranges, an offset amount that a center voltage between two threshold voltage distributions differs from a center reference voltage used to read the plurality of memory cells. Various methods for estimating the offset are described elsewhere within this Detailed Description. Embodiments include reading one or more of the plurality of memory cells using information derived from the estimated offset. The information derived from the estimated offset includes, in various embodiments, hard or soft decode information. Soft decode information includes improved LLR information. Hard decode information includes a new read reference voltage. For example, the new read reference voltage is derived from the estimated offset (e.g., the new read reference voltage is the center reference voltage that is shifted by the estimated offset). Next, embodiments include, at 519, reading (e.g., using the new read reference voltage) one or more of the plurality of memory cells using information derived from the estimated offset. In embodiments, a second decode check is performed at 521. If there is no failure, the data is output. If the decoding fails, the process may end or there may be one or more additional decoding retries. This procedure can be generalized to any number of reads greater than two.

Three methods are described herein for estimating the offset, and variance, from the numbers of memory cells having threshold voltages in the various voltage ranges (or bins) in accordance with various embodiments. These methods are not meant to be limiting, and other methods may be used without departing from embodiments of the present disclosure. The three described numerical methods are the bisection method, the predict-and-correct method, and the maximum-likelihood method.

The following discussion includes analytical equations, and the subsequent numerical methods to solve the equations, for the case of three reads (using three read reference voltages such as are depicted in FIG. 3b). The equations are presented for three reads primarily because three reads provide sufficient information to estimate two independent parameters (offset and variance). However, embodiments can be generalized to estimate the two parameters from a larger number of equations, thereby providing possibly better estimates of the parameters. A variety of methods (some of which will be outlined later) can be used for parameter estimation.

Read voltages for three reads are given by the set $\{r_1, r_2, r_3\}$. The three thresholds partition the threshold voltage distributions into four regions $R_0=(-\infty, r_1)$, $R_1=(r_1, r_2)$, $R_2=(r_2, r_3]$ and $R_3=(r_3, \infty)$ depending on the value of the voltage stored in the cell. N is the total number of cells read, and $N_0$, $N_1$, $N_2$ and $N_3$ denote the number of cells having threshold voltages in $R_0$, $R_1$, $R_2$ and $R_3$, respectively. As described above, in embodiments the purpose of estimating the offset and variance pair $(x, \sigma^2)$ consistent with $N_0$, $N_1$, $N_2$, and $N_3$ is to identify decode parameters, such as an improved read reference voltage (for hard decode) or LLRs based on x and $\sigma^2$. For those embodiments utilizing LLRs for soft decode, methods of determining LLR will be described below.

Let $p_0=N_0/N$, $p_1=N_1/N$, $p_2=N_2/N$ and $p_3=N_3/N$. The values of probabilities $p_1$ and $p_2$ are given by the below equations.

$$2p_1 = Q\left(\frac{r_1-(-1-x)}{\sigma}\right) - Q\left(\frac{r_2-(-1-x)}{\sigma}\right) + Q\left(\frac{(1-x)-r_2}{\sigma}\right) - Q\left(\frac{(1-x)-r_1}{\sigma}\right)$$

$$2p_2 = Q\left(\frac{r_2-(-1-x)}{\sigma}\right) - Q\left(\frac{r_3-(-1-x)}{\sigma}\right) + Q\left(\frac{(1-x)-r_3}{\sigma}\right) - Q\left(\frac{(1-x)-r_2}{\sigma}\right)$$

Where, Q(x) is defined as below $$Q(x) = \frac{1}{\sqrt{2\pi}} \int_x^\infty e^{\left(-\frac{u^2}{2}\right)} du$$

These above equations are highly non-linear and since the Q function is not an elementary function, it is very difficult to solve the equations directly. Therefore embodiments utilize numerical methods to estimate the offset x and the noise variance $\sigma^2$. One numerical method is the bisection method.

The bisection method is a root finding algorithm that is a consequence of the intermediate value theorem. Let f be a continuous function and [a, b] an interval such that f(a) and f(b) have opposite signs. The intermediate value theorem (IMV) states that there exists c, a<c<b, such that f(c)=0. The IMV can be used to find a root of f in the following manner.
1. Identify two values a and b such that f(a) and f(b) have opposite signs
2. Evaluate f at c=(a+b)/2; i.e., at the midpoint of a and b
    a. If f(c)=0, then c is a root of f. Exit
    b. If f(a) and f(c) have the same sign, then set a=c
    c. If f(b) and f(c) have opposite signs, then set b=c
3. Repeat Step 2 a fixed number of times or till it outputs a root, whichever is earlier
4. Output c The advantages of the bisection method are its simplicity and generality. While the rate of convergence is slow, the precision of the solution can be increased by increasing the number of times the bisection step is carried out. Also, since the absolute error decreases by a factor of two in every step, the number of steps can be determined depending on the accuracy required. Next, techniques for computing the offset and variance using the bisection method will be described.

In order to solve the above set of equations efficiently with low-complexity, certain assumptions are used. These assumptions are justified by the physical characteristics of a memory device, such as a flash memory device. Without loss of generality, the value of the offset x is assumed to lie in the interval [0 0.6]. If the voltages shift in the opposite direction, the histogram is flipped from left to right, the parameters are computed, and then the sign of the computed offset x is flipped. Further, the noise variance is assumed to lie in the interval [0.1 0.8]. Functions f and g are defined as follows.

$$f(x) = 2p_1 - Q\left(\frac{r_1-(-1-x)}{\sigma}\right) - Q\left(\frac{r_2-(-1-x)}{\sigma}\right) + Q\left(\frac{(1-x)-r_2}{\sigma}\right) - Q\left(\frac{(1-x)-r_1}{\sigma}\right)$$

$$g(\sigma) = 2p_2 - Q\left(\frac{r_2-(-1-x)}{\sigma}\right) - Q\left(\frac{r_3-(-1-x)}{\sigma}\right) + Q\left(\frac{(1-x)-r_3}{\sigma}\right) - Q\left(\frac{(1-x)-r_2}{\sigma}\right)$$

Bisection Method:

It has been verified that for the above assumptions, that the functions f and g are suitable for the bisection method. Applying the bisection method on f gives a value of x (known as refining shift or offset) and the bisection method on g gives a value of $\sigma$ (known as refining sigma). We can alternate the bisection method between f and g to successively refine x and $\sigma$. However, it is important to identify two values a and b which can be used as starting points for the bisection method. While the values of 0.1 and 0.8 for $\sigma$ serve as end points for g for any value of x, the same is not true for the endpoints for x when applying bisection on f. Hence, embodiments utilize the additional step of finding a suitable σ for which the end points 0 and 1 are suitable for the bisection method on f (known as initializing sigma). A pseudo-code description of the bisection method is provided below. The bisection method iterates the following three steps (initializing sigma, refining shift, and refining sigma) for a fixed number of times denoted by k. To begin with, embodiments set σ=0.8–0.001.

Initializing Sigma:
Input: σ
Output: σ

$$a = Q\left(\frac{1-r_3}{\sigma}\right) - Q\left(\frac{1-r_2}{\sigma}\right) + Q\left(\frac{r_2+1}{\sigma}\right) - Q\left(\frac{r_3+1}{\sigma}\right)$$

$$b = 0.5 - Q\left(\frac{r_3-r_2}{\sigma}\right) + Q\left(\frac{2+r_2}{\sigma}\right) - Q\left(\frac{2+r_3}{\sigma}\right)$$

while (sgn($p_2$–a)==sgn($p_2$–b))
σ=σ–0.01

$$a = Q\left(\frac{1-r_3}{\sigma}\right) - Q\left(\frac{1-r_2}{\sigma}\right) + Q\left(\frac{r_2+1}{\sigma}\right) - Q\left(\frac{r_3+1}{\sigma}\right)$$

$$b = 0.5 - Q\left(\frac{r_3-r_2}{\sigma}\right) + Q\left(\frac{2+r_2}{\sigma}\right) - Q\left(\frac{2+r_3}{\sigma}\right)$$

end
return σ

Refining Shift:
Input: σ, k
Output: x
$x_1=0$
$x_2=1$
Iterate the following steps k times $$x_3 = \frac{(x_1+x_2)}{2}$$

$$A = 2p_2 - \left(Q\left(\frac{r_2-(-1-x_1)}{\sigma}\right) - Q\left(\frac{r_3-(-1-x_1)}{\sigma}\right) + Q\left(\frac{(1-x_1)-r_3}{\sigma}\right) - Q\left(\frac{(1-x_1)-r_2}{\sigma}\right)\right)$$

$$B = 2p_2 - \left(Q\left(\frac{r_2-(-1-x_3)}{\sigma}\right) - Q\left(\frac{r_3-(-1-x_3)}{\sigma}\right) + Q\left(\frac{(1-x_3)-r_3}{\sigma}\right) - Q\left(\frac{(1-x_3)-r_2}{\sigma}\right)\right)$$

if (sgn(A)==sgn(B))
$x_1=x_3$
else
$x_2=x_3$ return $x=x_3$

Refining Sigma:
Input: x, k
Output: σ
$\sigma_1=0.1$
$\sigma_2=0.8$
Iterate the following steps k times $$\sigma_3 = \frac{(\sigma_1+\sigma_2)}{2}$$

$$A = 2p_1 - \left(Q\left(\frac{r_1-(-1-x_1)}{\sigma_1}\right) - Q\left(\frac{r_2-(-1-x_1)}{\sigma_1}\right) + Q\left(\frac{(1-x)-r_2}{\sigma_1}\right) - Q\left(\frac{(1-x)-r_1}{\sigma_1}\right)\right)$$

$$B = 2p_2 - \left(Q\left(\frac{r_1-(-1-x)}{\sigma_3}\right) - Q\left(\frac{r_2-(-1-x)}{\sigma_3}\right) + Q\left(\frac{(1-x)-r_2}{\sigma_3}\right) - Q\left(\frac{(1-x)-r_1}{\sigma_3}\right)\right)$$

if (sgn(A)==sgn(B))
$\sigma_1=\sigma_3$
else
$\sigma_2=\sigma_3$
return σ=$\sigma_3$ Predict-and-Correct Approach:

In this approach, the following equations are iterated a fixed number of times:

$$\frac{(1-x)-r_3}{\sigma} = Q^{-1}(2p_2)$$

$$\frac{r_1-(-1-x)}{\sigma} = Q^{-1}(2p_1)$$

$$\sigma = \left(\frac{2+r_1-r_3}{Q^{-1}(2p_2)+Q^{-1}(2p_1)}\right)$$

$$x = 1-(\sigma*Q^{-1}(2p_2)+r_3)$$

$$2p_2 = 2p_2 - Q\left(\frac{r_2-(-1-x)}{\sigma}\right) + Q\left(\frac{r_3-(-1-x)}{\sigma}\right) + Q\left(\frac{(1-x)-r_2}{\sigma}\right)$$

$$2p_1 = 2p_1 - Q\left(\frac{(1-x)-r_2}{\sigma}\right) + Q\left(\frac{r_2-(-1-x)}{\sigma}\right) + Q\left(\frac{(1-x)-r_1}{\sigma}\right)$$

This approach does not always work and if offset x is greater than a certain amount, the predict-and-correct approach may not converge to a solution. In that case, the below set of equations are iteratively executed by embodiments:

$$\frac{(1-x)-r_3}{\sigma} = Q^{-1}(2p_2)$$

$$\frac{(1-x)-r_2}{\sigma} = Q^{-1}(2p_1)$$

$$\sigma = \left(\frac{r_3-r_2}{Q^{-1}(2p_1)-Q^{-1}(2p_2)}\right)$$

$$x = 1-(\sigma*Q^{-1}(2p_2)+r_3)$$

$$2p_2 = 2p_2 - Q\left(\frac{r_2-(-1-x)}{\sigma}\right) + Q\left(\frac{r_3-(-1-x)}{\sigma}\right) + Q\left(\frac{(1-x)-r_2}{\sigma}\right)$$

$$2p_1 = 2p_1 - Q\left(\frac{r_1-(-1-x)}{\sigma}\right) + Q\left(\frac{r_2-(-1-x)}{\sigma}\right) + Q\left(\frac{(1-x)-r_1}{\sigma}\right)$$

Maximum-Likelihood Method

In this method, for each (x, σ) in a set of (x, σ), the following equations are evaluated, and the value of (x, σ) that results in the lowest value of C(x, σ) are used as the estimate for offset x and σ.

$$A = \left( \frac{2p_1 - \left(Q\left(\frac{r_1-(-1-x)}{\sigma}\right) - Q\left(\frac{r_2-(-1-x)}{\sigma}\right) + Q\left(\frac{(1-x)-r_2}{\sigma}\right) - Q\left(\frac{(1-x)-r_1}{\sigma}\right)\right)}{2p_1} \right)$$

$$B = \left( \frac{2p_2 - \left(Q\left(\frac{r_2-(-1-x)}{\sigma}\right) - Q\left(\frac{r_3-(-1-x)}{\sigma}\right) + Q\left(\frac{(1-x)-r_3}{\sigma}\right) - Q\left(\frac{(1-x)-r_2}{\sigma}\right)\right)}{2p_2} \right)$$

$$C(x,\sigma) = A+B$$

LLR Assignment

As noted above, in various embodiments the offset x is used to determine LLRs for each of the ranges of threshold voltages determined using the various reads. LLR assignment for a given offset x and σ is given by the following set of equations, where Bins 1-4 are the threshold voltage regions defined by $r_1$, $r_2$, and $r_3$.

$$LLR(Bin\ 1) = \log\left(\frac{Q\left(\frac{(1-x)-r_1}{\sigma}\right)}{0.5 - Q\left(\frac{r_1-(-1-x)}{\sigma}\right)}\right)$$

$$LLR(Bin\ 2) = \log\left(\frac{Q\left(\frac{(1-x)-r_2}{\sigma}\right) - Q\left(\frac{(1-x)-r_1}{\sigma}\right)}{Q\left(\frac{r_1-(-1-x)}{\sigma}\right) - Q\left(\frac{r_2-(-1-x)}{\sigma}\right)}\right)$$

$$LLR(Bin\ 3) = \log\left(\frac{Q\left(\frac{(1-x)-r_3}{\sigma}\right) - Q\left(\frac{(1-x)-r_2}{\sigma}\right)}{Q\left(\frac{r_2-(-1-x)}{\sigma}\right) - Q\left(\frac{r_3-(-1-x)}{\sigma}\right)}\right)$$

$$LLR(Bin\ 4) = \log\left(\frac{0.5 - Q\left(\frac{(1-x)-r_3}{\sigma}\right)}{Q\left(\frac{r_3-(-1-x)}{\sigma}\right)}\right)$$

The methods presented above for the estimation of the shift and noise variance as well as the assignment of LLRs can be easily generalized to multi-level cell (MLC) flash devices. Even though in MLC flash devices each cell stores k-bits, the k bits can be read independently. The histograms can be collected for each bit separately. The only difference would be that the histograms for MLC flash devices need to be scaled by a factor to take into account the MLC nature of the flash cells. Once the histogram is properly scaled, the estimation of parameters is similar to the approach described herein. Scaling should also be taken into account during LLR assignment.

Although specific embodiments have been illustrated and described herein, a wide variety of alternate and/or equivalent implementations are substituted for the specific embodiments shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. An apparatus comprising:
a memory array; and
control circuitry coupled to the memory array, wherein the control circuitry is configured to
based on a plurality of read comparison results, determine, for each voltage range of a plurality of voltage ranges, a corresponding number of memory cells of the memory array that have threshold voltages that fall into a corresponding voltage range of the plurality of voltage ranges, wherein a plurality of numbers of memory cells of the memory array is determined corresponding to the plurality of voltage ranges, and wherein (i) N1 represents a number of memory cells of the memory array that have threshold voltages that fall into a first voltage range of the plurality of voltage ranges, (ii) N2 represents a number of memory cells of the memory array that have threshold voltages that fall into a second voltage range of the plurality of voltage ranges, and (iii) N represents a total number of memory cells of the memory array on which the plurality of read comparison results are based,
determine (i) a first factor p1 that is based on a ratio of N1 and N, and (ii) a second factor p2 that is based on a ratio of N2 and N,
based on (i) the plurality of numbers of memory cells of the memory array determined corresponding to the plurality of voltage ranges and (ii) the first factor p1 and the second factor p2, estimate an offset amount that a center voltage between two threshold voltage distributions differs from a center reference voltage,
based on the estimated offset amount, calibrate, for each of the plurality of voltage ranges, a corresponding log likelihood ratio (LLR) such that a plurality of LLRs is calibrated corresponding to the plurality of voltage ranges, wherein an LLR assigned to a given voltage range of the plurality of voltage ranges provides a probability with which a memory cell, having threshold voltage into the given voltage range, stores a bit 0 or a bit 1, and
based on the calibrated plurality of LLRs, decode the plurality of read comparison results to estimate data stored in one or more of the plurality of memory cells of the memory array.

2. The apparatus of claim 1, wherein the control circuitry is further configured to:
based on the estimated offset amount, read one or more of the plurality of memory cells of the memory array.

3. The apparatus of claim 1, wherein:
the center reference voltage is an original center reference voltage assigned to the memory array;
the control circuitry is further configured to determine, based on the original center reference voltage and the offset amount, a modified center reference voltage; and
the control circuitry is further configured to read, based on the modified center reference voltage, one or more of the plurality of memory cells of the memory array.

4. The apparatus of claim 1, wherein:
the control circuitry is further configured to perform an initial read based on the center reference voltage; and
the control circuitry is further configured to perform, upon a determination of a decode failure associated with the initial read, reads of one or more of the plurality of memory cells of the memory array using a plurality of read reference voltages to generate the plurality of read comparison results, wherein the plurality of read reference voltages defines the plurality of voltage ranges.

5. The apparatus of claim 4, wherein each read reference voltage of the plurality of read reference voltages is between the two threshold voltage distributions.

6. The apparatus of claim 1, wherein each voltage range of the plurality of voltage ranges has at least one end-point between (i) a mean value of a first one of the two threshold voltages distributions, and (ii) a mean value of a second one of the two threshold voltages distributions.

7. The apparatus of claim 1, wherein:
the control circuitry is further configured to estimate the offset amount by iterative calculation of sets of bin data to determine a threshold voltage distribution parameter set that approximates the determined numbers of memory cells that have threshold voltages in each of the plurality of voltage ranges; and
the parameter set includes estimated offset amounts of the two threshold voltage distributions and variance estimates of the two threshold voltage distributions.

8. The apparatus of claim 1, wherein the control circuitry is further configured to estimate the offset amount by use of a bisection method that iteratively solves the following equations upon a determination of starting points for f(x) and g(σ):

$$f(x) = 2p_1 - Q\left(\frac{r_1 - (-1-x)}{\sigma}\right) -$$
$$Q\left(\frac{r_1 - (-1-x)}{\sigma}\right) + Q\left(\frac{(1-x) - r_2}{\sigma}\right) - Q\left(\frac{(1-x) - r_1}{\sigma}\right)$$
$$g(\sigma) = 2p_2 - Q\left(\frac{r_2 - (-1-x)}{\sigma}\right) - Q\left(\frac{r_3 - (-1-x)}{\sigma}\right) +$$
$$Q\left(\frac{(1-x) - r_3}{\sigma}\right) - Q\left(\frac{(1-x) - r_2}{\sigma}\right)$$

where x is the offset amount, where σ is square-root of variance, where $r_1$, $r_2$, and $r_3$ are plurality of read reference voltages that define the plurality of voltage ranges, and where:

$$Q(x) = \frac{1}{\sqrt{2\pi}} \int_x^\infty e^{\left(-\frac{u^2}{2}\right)} du.$$

9. The apparatus of claim 1, wherein the control circuitry is further configured to estimate the offset amount by iteration of the following equations a fixed number of times to converge on a value for x:

$$\frac{(1-x) - r_3}{\sigma} = Q^{-1}(2p_2)$$
$$\frac{r_1 - (-1-x)}{\sigma} = Q^{-1}(2p_1)$$
$$\sigma = \left(\frac{2 + r_1 - r_3}{Q^{-1}(2p_2) + Q^{-1}(2p_1)}\right)$$

$$x = 1 - (\sigma * Q^{-1}(2p_2) + r_3)$$

$$2p_2 = 2p_2 - Q\left(\frac{r_2 - (-1-x)}{\sigma}\right) + Q\left(\frac{r_3 - (-1-x)}{\sigma}\right) + Q\left(\frac{(1-x) - r_2}{\sigma}\right)$$
$$2p_1 = 2p_1 - Q\left(\frac{(1-x) - r_2}{\sigma}\right) + Q\left(\frac{r_2 - (-1-x)}{\sigma}\right) + Q\left(\frac{(1-x) - r_1}{\sigma}\right)$$

where x is offset, where σ is variance, where $r_1$, $r_2$, and $r_3$ are plurality of read reference voltages that define the plurality of voltage ranges, and where:

$$Q(x) = \frac{1}{\sqrt{2\pi}} \int_x^\infty e^{\left(-\frac{u^2}{2}\right)} du.$$

10. A method comprising:
based on a plurality of read comparison results, determining, for each voltage range of a plurality of voltage ranges, a corresponding number of memory cells of a memory array that have threshold voltages that fall into a corresponding voltage range of the plurality of voltage ranges, wherein a plurality of numbers of memory cells of the memory array is determined corresponding to the plurality of voltage ranges, wherein (i) N1 represents a number of memory cells of the memory array that have threshold voltages that fall into a first voltage range of the plurality of voltage ranges, (ii) N2 represents a number of memory cells of the memory array that have threshold voltages that fall into a second voltage range of the plurality of voltage ranges, and (iii) N represents a total number of memory cells of the memory array on which the plurality of read comparison results are based
based on (i) the plurality of numbers of memory cells of the memory array determined corresponding to the plurality of voltage ranges, (ii) a ratio of N1 and N, and (iii) a ratio of N2 and N, estimating an offset amount that a center voltage between two threshold voltage distributions differs from a center reference voltage;
based on the estimated offset amount, calibrating, for each of the plurality of voltage ranges, a corresponding log likelihood ratio (LLR) such that a plurality of LLRs is calibrated corresponding to the plurality of voltage ranges, wherein an LLR assigned to a given voltage range of the plurality of voltage ranges provides a probability with which a memory cell, having threshold voltage into the given voltage range, stores a bit 0 or a bit 1; and
based on the calibrated plurality of LLRs, reading one or more of the plurality of memory cells of the memory array.

11. The method of claim 10, wherein reading one or more of the plurality of memory cells of the memory array further comprises:
based on the estimated offset amount, reading one or more of the plurality of memory cells of the memory array.

12. The method of claim 10, wherein the center reference voltage is an original center reference voltage assigned to the memory array, and wherein the method further comprises:
based on the original center reference voltage and the offset amount, determining a modified center reference voltage,
wherein reading one or more of the plurality of memory cells of the memory array further comprises
based on the modified center reference voltage, reading one or more of the plurality of memory cells of the memory array.

13. The method of claim 10, further comprising:
performing an initial read based on the center reference voltage; and
upon a determination of a decode failure associated with the initial read, performing reads of one or more of the plurality of memory cells of the memory array using a plurality of read reference voltages to generate the plurality of read comparison results, wherein the plurality of read reference voltages defines the plurality of voltage ranges.

14. The method of claim 13, wherein each read reference voltage of the plurality of read reference voltages is between the two threshold voltage distributions.

15. The method of claim 10, wherein each voltage range of the plurality of voltage ranges has at least one end-point between (i) a mean value of a first one of the two threshold voltages distributions, and (ii) a mean value of a second one of the two threshold voltages distributions.

16. The method of claim 10, wherein estimating the offset amount comprises:
    estimating the offset amount by iterative calculation of sets of bin data to determine a threshold voltage distribution parameter set that approximates the determined numbers of memory cells that have threshold voltages in each of the plurality of voltage ranges, wherein the parameter set includes estimated offset amounts of the two threshold voltage distributions and variance estimates of the two threshold voltage distributions.

17. The method of claim 1, further comprising:
    determining (i) a first factor p1 that is based on the ratio of N1 and N, and (ii) a second factor p2 that is based on the ratio of N2 and N.

18. The method of claim 17, wherein estimating the offset amount further comprises:
    estimating the offset amount by use of a bisection method that iteratively solves the following equations upon a determination of starting points for f(x) and g(σ):

$$f(x) = 2p_1 - Q\left(\frac{r_1 - (-1-x)}{\sigma}\right) -$$
$$Q\left(\frac{r_1 - (-1-x)}{\sigma}\right) + Q\left(\frac{(1-x) - r_2}{\sigma}\right) - Q\left(\frac{(1-x) - r_1}{\sigma}\right)$$
$$g(\sigma) = 2p_2 - Q\left(\frac{r_2 - (-1-x)}{\sigma}\right) - Q\left(\frac{r_3 - (-1-x)}{\sigma}\right) +$$
$$Q\left(\frac{(1-x) - r_3}{\sigma}\right) - Q\left(\frac{(1-x) - r_2}{\sigma}\right)$$

where x is the offset amount, where σ is square-root of variance, where $r_1$, $r_2$, and $r_3$ are plurality of read reference voltages that define the plurality of voltage ranges, and where:

$$Q(x) = \frac{1}{\sqrt{2\pi}} \int_x^\infty e^{\left(-\frac{u^2}{2}\right)} du.$$

19. The method of claim 17, wherein estimating the offset amount further comprises:
    estimating the offset amount by iteration of the following equations a fixed number of times to converge on a value for x:

$$\frac{(1-x) - r_3}{\sigma} = Q^{-1}(2p_2)$$
$$\frac{r_1 - (-1-x)}{\sigma} = Q^{-1}(2p_1)$$
$$\sigma = \left(\frac{2 + r_1 - r_3}{Q^{-1}(2p_2) + Q^{-1}(2p_1)}\right)$$

$$x = 1 - (\sigma * Q^{-1}(2p_2) + r_3)$$

$$2p_2 = 2p_2 - Q\left(\frac{r_2 - (-1-x)}{\sigma}\right) + Q\left(\frac{r_3 - (-1-x)}{\sigma}\right) + Q\left(\frac{(1-x) - r_2}{\sigma}\right)$$
$$2p_1 = 2p_1 - Q\left(\frac{(1-x) - r_2}{\sigma}\right) + Q\left(\frac{r_2 - (-1-x)}{\sigma}\right) + Q\left(\frac{(1-x) - r_1}{\sigma}\right)$$

where x is offset, where σ is variance, where $r_1$, $r_2$, and $r_3$ are plurality of read reference voltages that define the plurality of voltage ranges, and where:

$$Q(x) = \frac{1}{\sqrt{2\pi}} \int_x^\infty e^{\left(-\frac{u^2}{2}\right)} du.$$

20. An apparatus comprising:
    a memory array; and
    control circuitry coupled to the memory array, wherein the control circuitry is configured to
        based on a plurality of read comparison results, determine, for each voltage range of a plurality of voltage ranges, a corresponding number of memory cells of the memory array that have threshold voltages that fall into a corresponding voltage range of the plurality of voltage ranges, wherein a plurality of numbers of memory cells of the memory array is determined corresponding to the plurality of voltage ranges, and wherein (i) N1 represents a number of memory cells of the memory array that have threshold voltages that fall into a first voltage range of the plurality of voltage ranges, (ii) N2 represents a number of memory cells of the memory array that have threshold voltages that fall into a second voltage range of the plurality of voltage ranges, and (iii) N represents a total number of memory cells of the memory array on which the plurality of read comparison results are based,
        determine (i) a first factor p1 that is based on a ratio of N1 and N, and (ii) a second factor p2 that is based on a ratio of N2 and N,
        based on the first factor p1 and the second factor p2, estimate a first parameter that is usable for estimating data stored in one or more of the plurality of memory cells of the memory array.

21. The apparatus of claim 20, wherein the first parameter is a variance of a threshold voltage distribution associated with the memory array.

22. The apparatus of claim 20, wherein the first parameter is an offset amount that a center voltage between two threshold voltage distributions differs from a center reference voltage.

23. The apparatus of claim 20, wherein the control circuitry is further configured to, based at least in part on the first parameter, read the one or more of the plurality of memory cells.

24. The apparatus of claim 20, wherein the control circuitry is further configured to:
    based on the first parameter, calibrate, for each of the plurality of voltage ranges, a corresponding log likelihood ratio (LLR) such that a plurality of LLRs is calibrated corresponding to the plurality of voltage ranges, wherein an LLR assigned to a given voltage range of the plurality of voltage ranges provides a probability with which a memory cell, having threshold voltage into the given voltage range, stores a bit 0 or a bit 1; and based on the calibrated plurality of LLRs, decode the plurality of read comparison results to estimate the data stored in the one or more of the plurality of memory cells of the memory array.

* * * * *